(12) United States Patent
Filippi et al.

(10) Patent No.: US 8,633,707 B2
(45) Date of Patent: Jan. 21, 2014

(54) STACKED VIA STRUCTURE FOR METAL FUSE APPLICATIONS

(75) Inventors: Ronald G. Filippi, Wappingers Falls, NY (US); Griselda Bonilla, Fishkill, NY (US); Kaushik Chanda, Fishkill, NY (US); Stephan Grunow, Poughkeepsie, NY (US); Naftali E. Lustig, Croton-on-Hudson, NY (US); Andrew H. Simon, Fishkill, NY (US); Ping-Chuan Wang, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 378 days.

(21) Appl. No.: 13/074,407

(22) Filed: Mar. 29, 2011

(65) Prior Publication Data
US 2012/0249159 A1 Oct. 4, 2012

(51) Int. Cl.
*G01R 31/07* (2006.01)
(52) U.S. Cl.
USPC .......................................... 324/550; 324/507
(58) Field of Classification Search
USPC .................... 324/550, 507; 438/132; 257/529
See application file for complete search history.

(56) References Cited

U.S. PATENT DOCUMENTS

| | | | |
|---|---|---|---|
| 6,100,118 A | 8/2000 | Shih et al. | |
| 6,157,583 A | 12/2000 | Starnes et al. | |
| 6,218,279 B1 | 4/2001 | Weber et al. | |
| 6,521,971 B2 | 2/2003 | Tsai | |
| 6,611,039 B2 | 8/2003 | Anthony | |
| 6,756,655 B2 | 6/2004 | Le et al. | |
| 6,900,533 B2 | 5/2005 | Burton | |
| 7,205,588 B2 | 4/2007 | Jeng et al. | |
| 7,528,066 B2 | 5/2009 | Yang et al. | |
| 7,649,240 B2 | 1/2010 | Kim et al. | |
| 7,679,871 B2 | 3/2010 | Okada et al. | |
| 7,704,805 B1 * | 4/2010 | Cheng et al. | 438/132 |
| 7,732,314 B1 | 6/2010 | Danek et al. | |
| 2003/0214043 A1 | 11/2003 | Saitoh et al. | |
| 2004/0245601 A1 | 12/2004 | Koike | |
| 2005/0285222 A1 | 12/2005 | Thei et al. | |
| 2012/0126363 A1 * | 5/2012 | Wang et al. | 257/529 |

OTHER PUBLICATIONS

PCT Application No. PCT/US2012/028847, International Filing Date: Mar. 13, 2012, Applicant: International Business Machines Corporation, International Search Report and Written Opinion.

* cited by examiner

*Primary Examiner* — Vincent Q Nguyen
(74) *Attorney, Agent, or Firm* — L. Jeffrey Kelly; Catherine Ivers

(57) ABSTRACT

A back end of the line (BEOL) fuse structure having a stack of vias. The stacking of vias leads to high aspect ratios making liner and seed coverage inside the vias poorer. The weakness of the liner and seed layers leads to a higher probability of electromigration (EM) failure. The fuse structure addresses failures due to poor liner and seed coverage. Design features permit determining where failures occur, determining the extent of the damaged region after fuse programming and preventing further propagation of the damaged dielectric region.

17 Claims, 10 Drawing Sheets

STACKED VIA STRUCTURE FOR METAL FUSE APPLICATIONS

BACKGROUND OF THE INVENTION

1. Field of the Invention

The present invention relates to electronic fuses (e-fuses). More specifically, the present invention relates to stacked via structures for metal fuse applications.

2. Description of the Related Art

In advanced technologies, e-fuses have been implemented at the polycrystalline silicon (PC) level. During programming, a high current pulse of short duration is passed through the structure. This irreversibly migrates silicide on top of the PC, causing a change in resistance and thus acting as a programmable fuse.

As scaling progresses, it is becoming harder to implement these e-fuses at the PC level due to drop in maximum allowable currents through the first metal layer or conductor. Also, the collateral damage associated with the event is becoming more difficult to contain. As a result, there is a drive to implement these fuses at the metal interconnect levels and use the phenomenon of electromigration (EM) to program the fuses.

The power requirements to cause EM in copper (Cu) interconnects are much larger than the typical PC level fuses. This is partly due to the fact that the liner materials used in Cu interconnects, such as tantalum (Ta) and tantalum nitride (TaN), must be blown along with the Cu in order to achieve proper fuse programming. Hence, there is a need to devise fuse structures that are susceptible to EM without compromising the reliability of the remaining interconnects.

In a conventional metal fuse approach, as shown in FIG. 1, a two-level structure comprises conductor 11 embedded in dielectric layer 10, and via 21 and line 22 embedded in dielectric layer 20. A cap layer 23 is typically deposited over line 22 and dielectric layer 20. Electron flow is from via 21 into line 22. A high current is applied between the positive current connection (I+) and negative current connection (I−) to induce EM failure. Voltage across the structure is measured using the positive (V+) and negative (V−) voltage connections. The electron flow through the fuse structure is from the lower level metal, conductor 11, to the upper level metal, line 22.

With this design, some of the failures occur in via 21 while other failures occur in line 22, resulting in a lack of control over the failure location and leading to variability in the final resistance of the fuse structure after programming. Moreover, it is not possible to electrically determine whether the failure is in via 21 or line 22. Failures in line 22 are less desirable because cap layer 23 may be compromised during the programming process.

The programming process with this design may lead to damage in the surrounding dielectric layer 20. It is likely that material from the blown fuse area will be present in the damaged dielectric region. If this is the case, then there is concern that the material will migrate throughout the dielectric, causing a short circuit to neighboring lines.

Therefore, a structure is needed such that failures occur preferentially in the via and not the line. Also, a detection method is needed to determine whether the programming process causes damage in the via or the line. The structure should allow for determining whether material from the blown fuse area has migrated into the dielectric region. It would also be desirable to prevent further migration of the blown fuse material.

SUMMARY OF THE INVENTION

The present invention provides a back end of the line fuse structure. The fuse structure promotes failures in certain areas of a fuse. The present invention further provides a method for detecting where the failures occur in a fuse and a method for detecting damage in a fuse.

According to an embodiment of the present invention, a fuse structure is provided. The fuse structure includes: a first dielectric layer having a first conductive via and a first conductive line disposed in a first cavity formed in the first dielectric layer, the first conductive via and the first conductive line having a first liner disposed along at least vertical surfaces of the first cavity; a second dielectric layer above the first dielectric layer, the second dielectric layer having a second conductive via and a second conductive line disposed in a second cavity formed in the second dielectric layer, the second conductive via and the second conductive line being in electrical contact with the first conductive via and the first conductive line, and having a second liner disposed along at least vertical surfaces of the second cavity; wherein at least a portion of the first liner has a thickness less than the second liner.

According to a further embodiment of the present invention, another fuse structure is provided. The fuse structure includes: a first dielectric layer having a first conductive via and a first conductive line within a first dual damascene cavity formed in the first dielectric layer, the first conductive via and the first conductive line surrounded laterally by a first liner; a second dielectric layer above the first dielectric layer having a second conductive via and a second conductive line embedded within a second dual damascene cavity formed in the second dielectric layer, the second conductive via and second conductive line in electrical contact with the first conductive via and the first conductive line and surrounded laterally by a second liner; wherein the first liner surrounding laterally the first conductive via and the first conductive line has a thickness of less than about 30 nm, the second liner surrounding laterally the second conductive via and the second conductive line has a thickness of greater than about 30 nm.

According to another embodiment of the present invention, a further fuse structure is provided. The fuse structure includes: a first dielectric layer having a first conductive via and a first conductive line disposed in a first cavity formed in the first dielectric layer, the first conductive via and the first conductive line having a first liner disposed along at least vertical surfaces of the first cavity; a second dielectric layer disposed on the first dielectric layer, the second dielectric layer having a second conductive via and a second conductive line disposed in a second cavity formed in the second dielectric layer, the second conductive via and the second conductive line being in electrical contact with the first conductive via and the first conductive line, the second conductive line laterally extending around the second conductive via such that the conductive line extends in all directions wider than at least a diameter of an upper portion of the first conductive via, and having a second liner disposed along at least vertical surfaces of the second cavity; wherein the first liner has a thickness less than the second liner.

According to a further embodiment of the present invention, a method for electrically detecting failures in a conductive via and a conductive line is provided. The method includes the steps of: forcing current through a fuse structure between a positive current connection and a negative current connection; measuring voltage over each of a first voltage connection and a second voltage connection in the fuse structure; and detecting a failure in one of a conductive via and a conductive line; wherein failure occurs in the conductive via if an open circuit exists at both the first and second voltage connections such that there is no current flow at the voltage connections when current is forced; and wherein a failure occurs in the conductive line if an open circuit exists at only one of the first and second voltage connections such that there is no current flow at one of the voltage connections and an open circuit does not exist at the other when current is forced.

According to another embodiment of the present invention, a method for electrically detecting damage in dielectric regions of a fuse is provided. The method includes the steps of: applying voltage between a negative current connection and an positive current connection; measuring current between a positive current connection and a negative current connection; and detecting damage in a dielectric region wherein damage exists and has extended where a short circuit is measured between the positive current connection and the negative current connection.

According to a further embodiment of the present invention, a fuse structure for detecting material from damage by a blown fuse is provided. The fuse structure includes: a first dielectric layer disposed on the dielectric material having a first conductive via and a first conductive line disposed in a first cavity formed in the first dielectric layer, the first conductive via and the first conductive line having a first liner disposed along at least vertical surfaces of the first cavity; a second conductive via and a second conductive line disposed in a second cavity formed in the first dielectric layer and having a second liner disposed along at least vertical surfaces of the second cavity, wherein the second conductive via and the second conductive line are not in contact with the first conductive via and the first conductive line; a second dielectric layer disposed on the first dielectric layer, the second dielectric layer having a third conductive via and a third conductive line disposed in a third cavity formed in the second dielectric layer, the third conductive via and the third conductive line being in electrical contact with the first conductive via and the first conductive line, the second conductive line laterally extending around the third conductive via such that the third conductive line extends in all directions wider than at least a diameter of an upper portion of the first conductive via, and having a third liner disposed along at least vertical surfaces of the third cavity; wherein the first liner has a thickness less than the second liner.

According to another embodiment of the present invention, a method of manufacturing a fuse structure is provided. The method includes the steps of: forming a first cavity in a first dielectric layer, the first dielectric layer disposed on a dielectric material, the dielectric material having a conductor embedded therein, the first cavity in contact with the conductor; depositing a first liner on all surfaces of the first cavity; depositing a seed layer in the first cavity; filling the first cavity with a conductive material forming a first via and a first line; depositing a second dielectric layer laterally disposed on the first cavity; forming a second cavity in the second dielectric layer; depositing a second liner on all surfaces of the first cavity; depositing a second seed layer in the cavity; and filling the second cavity with a conductive material forming a second via and a second line, the second via and the second line being in electrical contact with the first via and the first line.

BRIEF DESCRIPTION OF THE DRAWINGS

The features and elements of the present invention are set forth with respect to the appended claims and illustrated in the drawings.

DETAILED DESCRIPTION OF THE PREFERRED EMBODIMENTS

The present invention provides a back end of the line (BEOL) fuse structure having a stack of vias. The stacking of vias leads to high aspect ratios, which makes liner and seed coverage inside of the vias poorer. This weakness in the liner and seed layers leads to a higher probability of electromigration (EM) failure. The present invention includes a fuse structure to address failures due to poor liner and seed coverage. Design features allow for determining the extent of the damaged region following fuse programming. Other design features make it possible to prevent further propagation of the damaged dielectric region.

The following describes embodiments of the present invention with reference to the drawings. The embodiments are illustrations of the invention, which can be embodied in various forms. The present invention is not limited to the embodiments described below, rather representative for teaching one skilled in the art how to make and use it. Some aspects of the drawings repeat from one drawing to the next. The aspects retain their same numbering from their first appearance throughout each of the preceding drawings.

Figure 2:
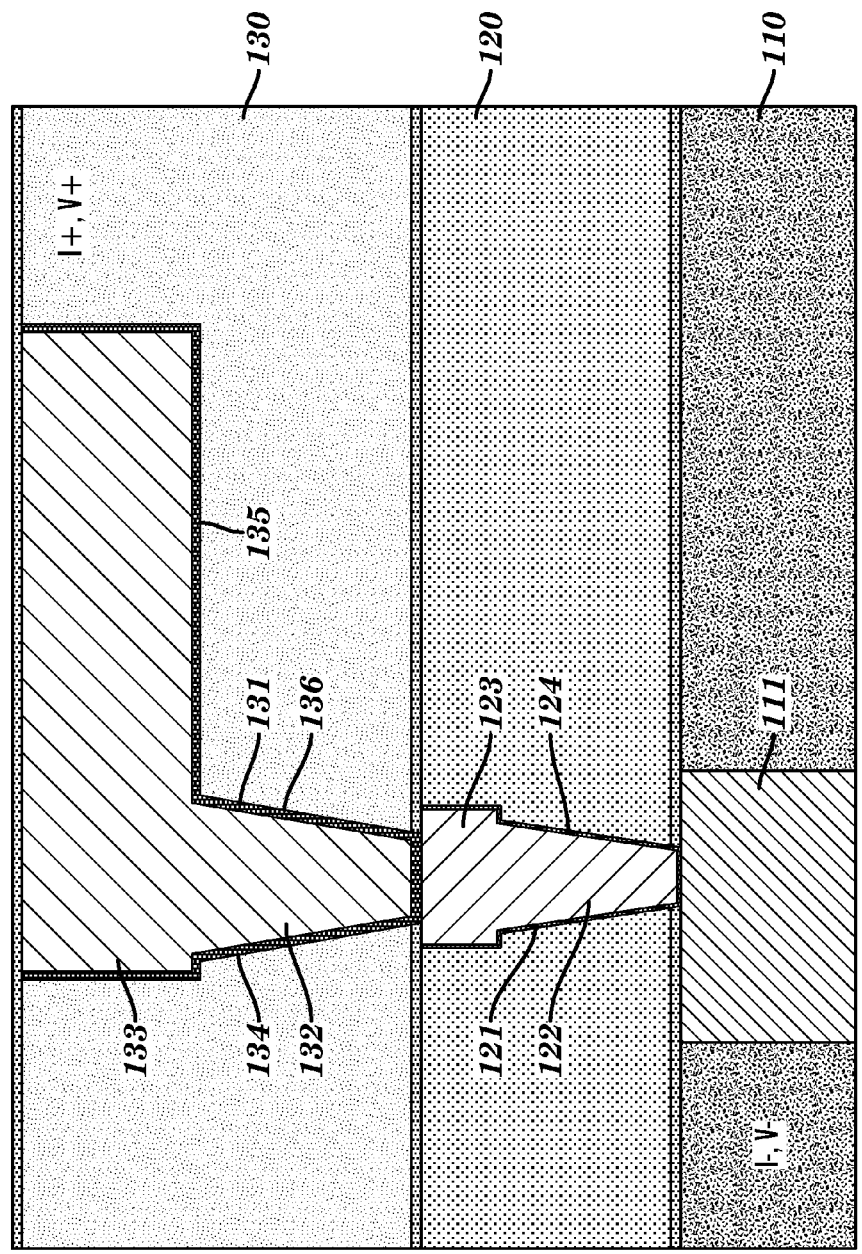
FIG. 2 illustrates a schematic cross section of the present invention having a stacked via metal fuse structure.

With reference now to FIG. 2, a fuse structure in accordance with the present invention is shown. The fuse structure is above and in electrical contact with conductor 111 embedded in dielectric material 110. Dielectric layer 120 is disposed above dielectric material 110. Conductive via 122 and conductive line 123 are disposed in cavity 121 formed in dielectric layer 120. Preferably, conductive line 123 is formed above conductive via 122. Liner 124 is disposed along at least vertical surfaces of cavity 121. Preferably, liner 124 is also disposed along a bottom surface of cavity 121.

Dielectric layer 130 is disposed above dielectric layer 120. Conductive via 132 and conductive line 133 are disposed in cavity 131 formed in dielectric layer 130. Conductive via 132 and line 133 are in electrical contact with conductive via 122 and conductive line 123. Liner 134 is disposed along at least vertical surfaces of cavity 131. Preferably, liner 134 is further disposed along a horizontal surface 135 beneath line 133, a bottom surface of cavity 131 and vertical surfaces of conductive line 133. The electron flow through the fuse structure is from the lower level metal, conductor 111, through conductive via 122, conductive line 123 and conductive via 132, to the upper level metal, conductive line 133.

Liner 124 preferably has poor coverage as compared to at least one portion of liner 134. Liner 124 preferably has a thickness less than the thickness of liner 134 such that upon application of high current between the positive current connection (I+) and negative voltage connection (I−) to induce electromigration (EM) failure, failure occurs preferentially in conductive via 122 rather than in conductive via 132 or conductive line 133. Specifically, liner 124 preferably has a thickness of less than about 30 nm and liner 134 preferably has a thickness of greater than about 30 nm. In this structure, EM failures are more likely to occur in conductive via 122 rather than in conductive via 132 or conductive line 133, because relatively lower power is required to cause a failure in conductive via 122 due to the poor coverage of liner 124.

Any suitable dielectric material may be used for dielectric material 110 and dielectric layers 120 and 130. The material used for each of dielectrics 110, 120 and 130 may be the same or different. Typical dielectric materials include any now known or later developed porous or non-porous dielectric material such as silicon oxide (SiO), silicon nitride ($Si_3N_4$), hydrogenated silicon oxycarbide (SiCOH), silsesquioxanes, carbon-doped oxides (i.e., organosilicates) that include atoms of silicon (Si), carbon (C), oxygen (O), and/or hydrogen (H), thermosetting polyarylene ethers, SiLK™ (a polyarylene ether available from Dow Chemical Corporation), spin-on silicon-carbon contained polymer material available from JSR Corporation, and other low dielectric constant (<3.9) materials or layers thereof.

A dielectric barrier layer or capping layer is disposed above each of dielectric material 110 and dielectric layers 120 and 130. The material used for each capping layer may be the same or different. Typical dielectric materials for the capping layer include any now known or later developed dielectric layer such a silicon carbide (SiC), silicon nitride ($Si_3N_4$), silicon dioxide ($SiO_2$), and nitrogen or hydrogen doped silicon carbide (SiC(N,H)).

Any suitable liner material may be used for liners 124 and 134, and the material used for each of liners 124 and 134 may be the same or different. Typical liner materials include tantalum (Ta), tantalum nitride (TaN), titanium (Ti), titanium nitride (TiN), tungsten (W), ruthenium (Ru) and ruthenium nitride (RuN).

Any suitable conductive material may be used for conductor 111, conductive via 122, conductive line 123, conductive via 132 and conductive line 133. The material used for each of conductor 111, conductive via 122, conductive line 123, conductive via 132 and conductive line 133 may be the same or different. Typical conductive materials include copper (Cu), aluminum (Al), silver (Ag), gold (Au) and alloys.

Figure 1:
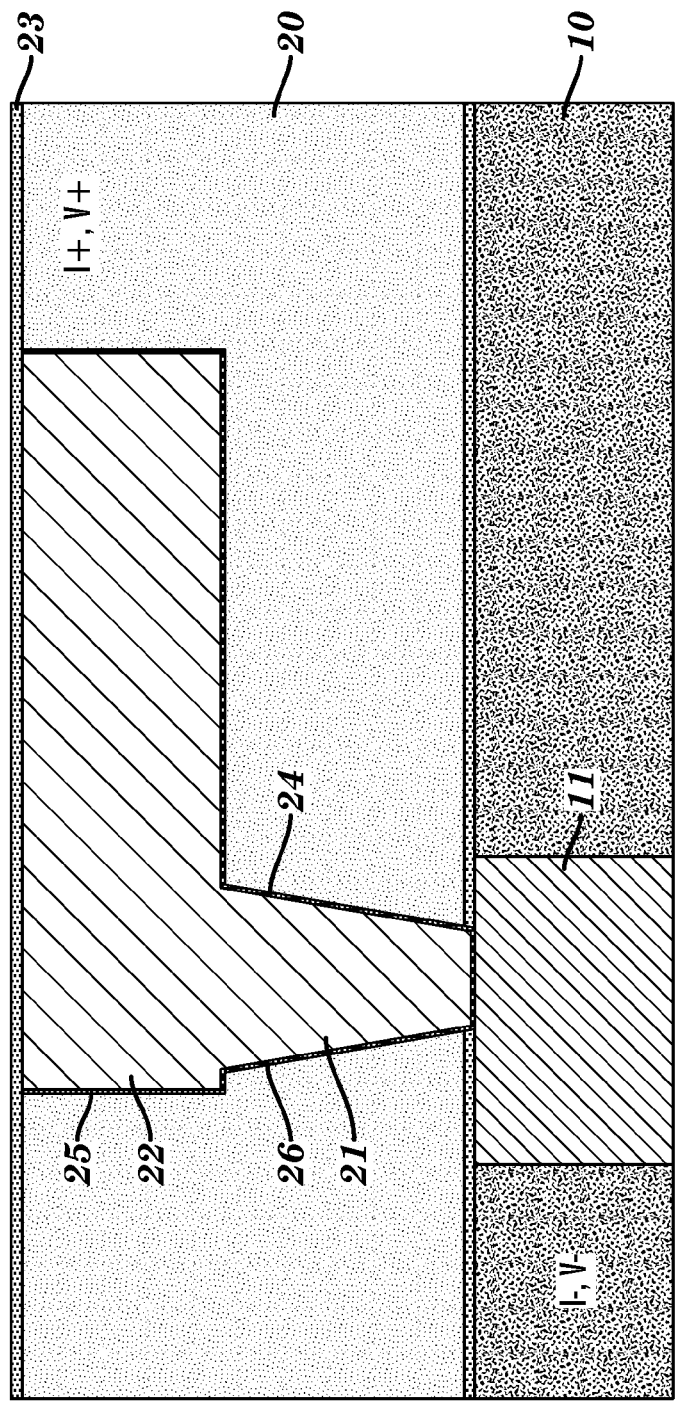
FIG. 1 illustrates a schematic cross section of a conventional metal fuse structure.

Due to the nature of the liner deposition process, liner coverage in the via depends on which via sidewall is being covered. In the case of Ta and TaN, a physical vapor deposition (PVD) process is used such that the line feature above the via will affect the liner coverage in the via. The same holds for the Cu seed layer that is deposited by PVD following liner deposition. In FIG. 1, poor liner coverage occurs on via sidewall 24 that is opposite to an end 25 of line 22 while good liner coverage occurs on the other via sidewall 26. This is a result of a dielectric shadowing effect in which the presence of a line end prevents liner material from adequately coating the opposite via sidewall. This represents a less than ideal situation since vias with good liner coverage will require higher power to be blown.

Figure 3:
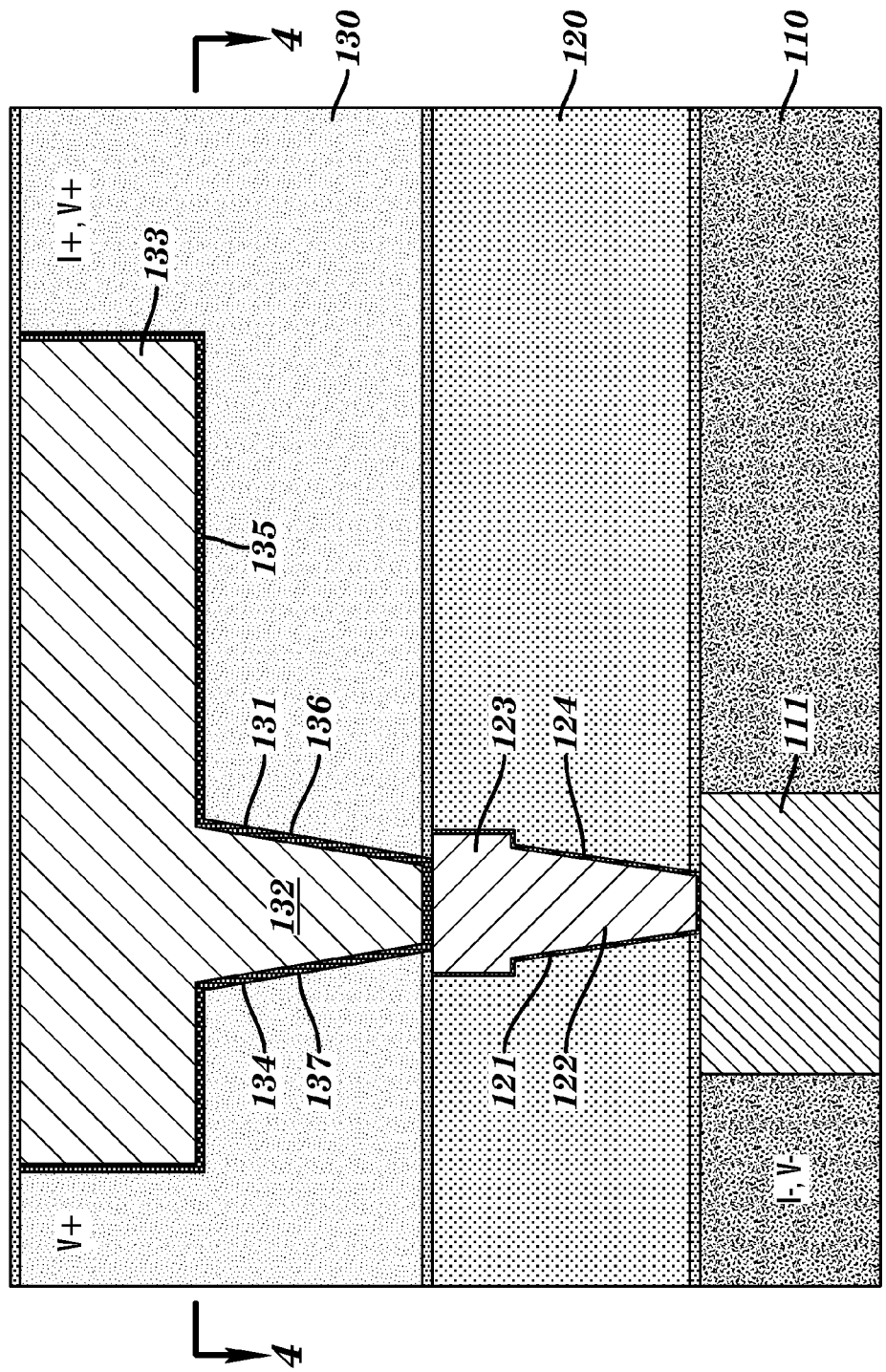
FIG. 3 illustrates a schematic cross section of the present invention having a stacked via metal fuse structure and an extended conductive line.
Figure 4:
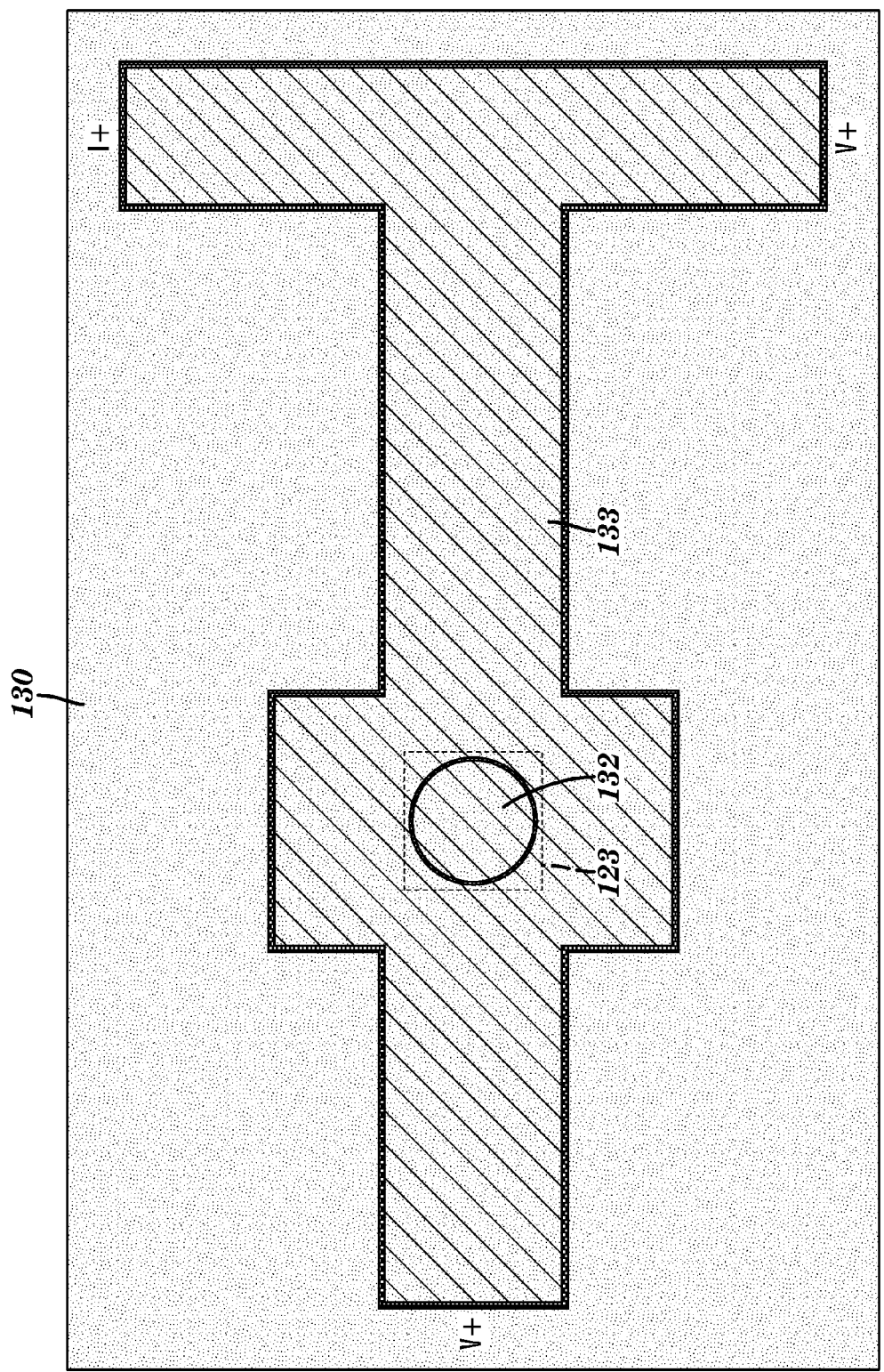
FIG. 4 illustrates a top view of the present invention having a stacked via metal fuse structure and an extended conductive line.

In order to combat the shadowing effect, a further embodiment of the present invention permits good liner and seed coverage throughout conductive via 132, because failures may still occur in conductive via 132 and conductive line 133. In a preferred embodiment of the present invention, liner coverage can be influenced by the extent to which the line opening extends laterally beyond the via opening. As shown in FIG. 2, conductive line 133 extends laterally beyond a side 136 of conductive via 132. Conductive line 133 can also extend laterally around conductive via 132 by a certain distance in all directions, as seen in FIG. 3. The extension will ensure good liner and seed coverage on sidewalls 136 and 137 of conductive via 132. Making the width of conductive line 133 much wider than the diameter of an upper portion of conductive via 122 in all directions, as seen in FIG. 4, ensures that all sidewalls of conductive via 132 receive good liner and seed coverage. As the width of conductive line 133 increases in all directions, liner and seed coverage of conductive via 132 continues to improve in all directions. The improvement in liner and seed coverage of conductive via 132 reduces the potential for failures occurring in conductive via 132 and conductive line 133 and promotes failures in conductive via 122.

Extending conductive line 133 also provides the ability to electrically distinguish between failures in conductive via 122, conductive via 132 and conductive line 133. Following fuse programming where a high current is forced through the fuse structure to blow the fuse, current is forced between a positive current connection (I+) at conductive line 133 and a negative current connection (I−) at conductor 111. The voltage across the structure would be measured over a positive voltage connection (V+) along conductive line 133 and a negative voltage connection (V−) at conductor 111. If an open circuit is measured at both of the positive (V+) voltage connections and the negative (V−) voltage connection, then the failure occurred in a conductive via, for example conductive via 122 in FIG. 3. Thus, there is no current flow at the voltage connections when current is forced. However, if an open circuit exists only at one of the positive voltage connections, then the failure occurs in a conductive line, for example conductive line 133 in FIG. 3. This testing can be used to screen parts such that only via failures are allowed in a product.

Figure 5:
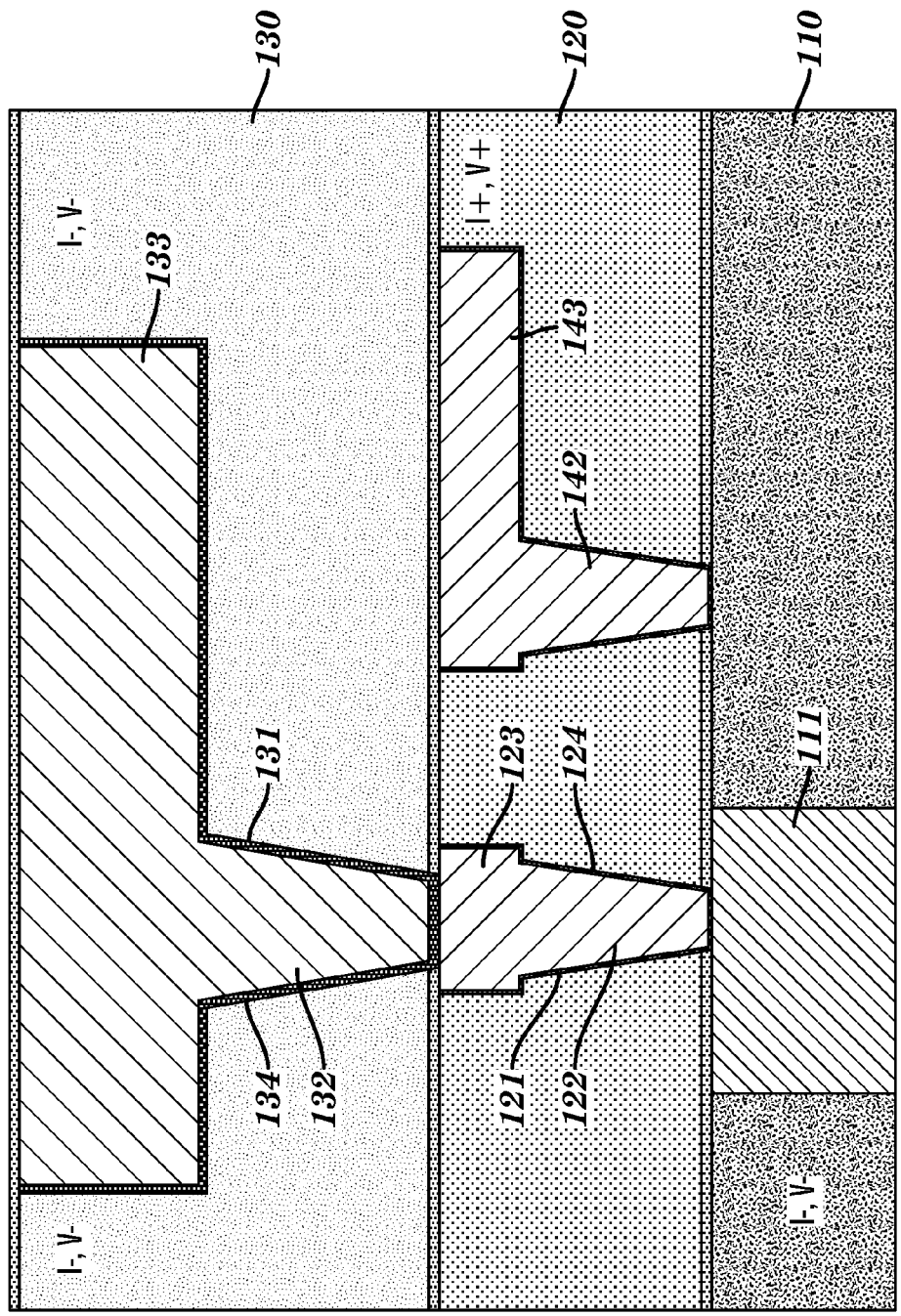
FIG. 5 illustrates a schematic cross section of the present invention having a stacked via metal fuse structure, an extended conductive line and an adjacent conductive via and conductive line.
Figure 6A:
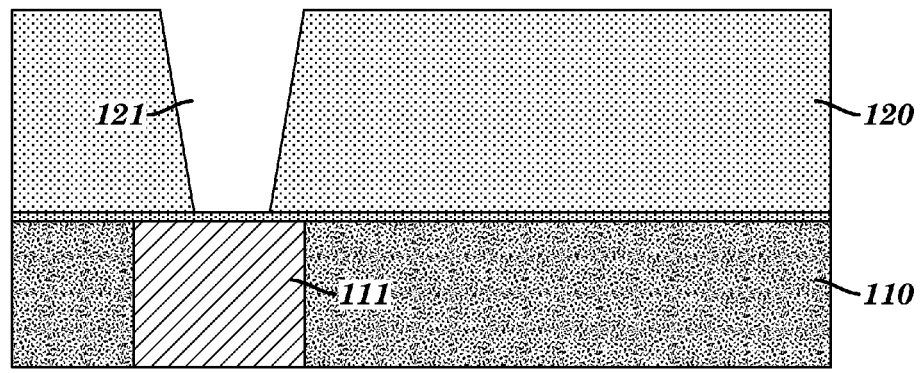
FIGS. 6A-6I illustrate the method of manufacturing the fuse structure of the present invention.
Figure 6B:
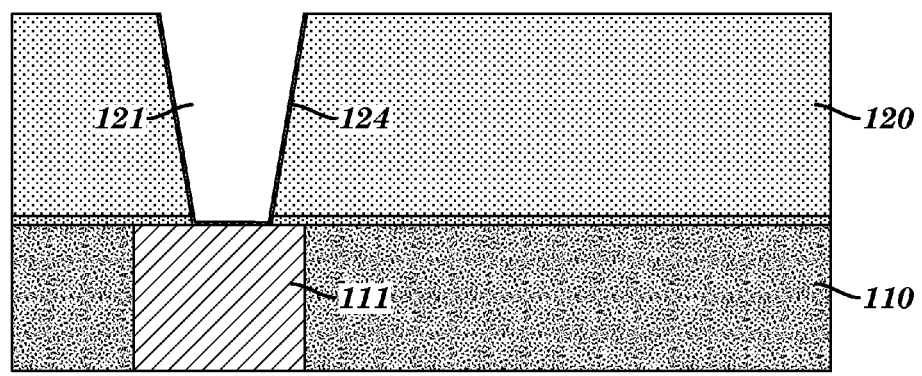
Figure 6C:
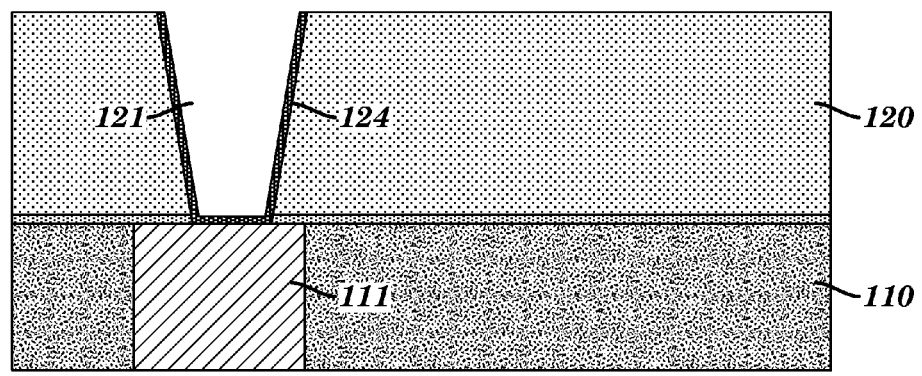
Figure 6D:
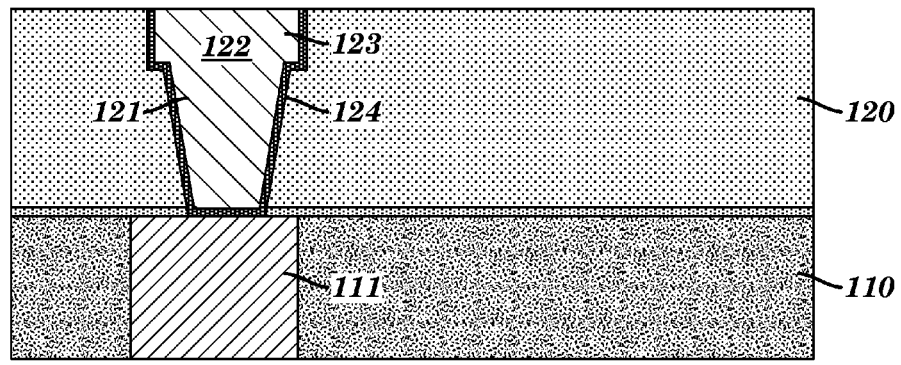
Figure 6E:
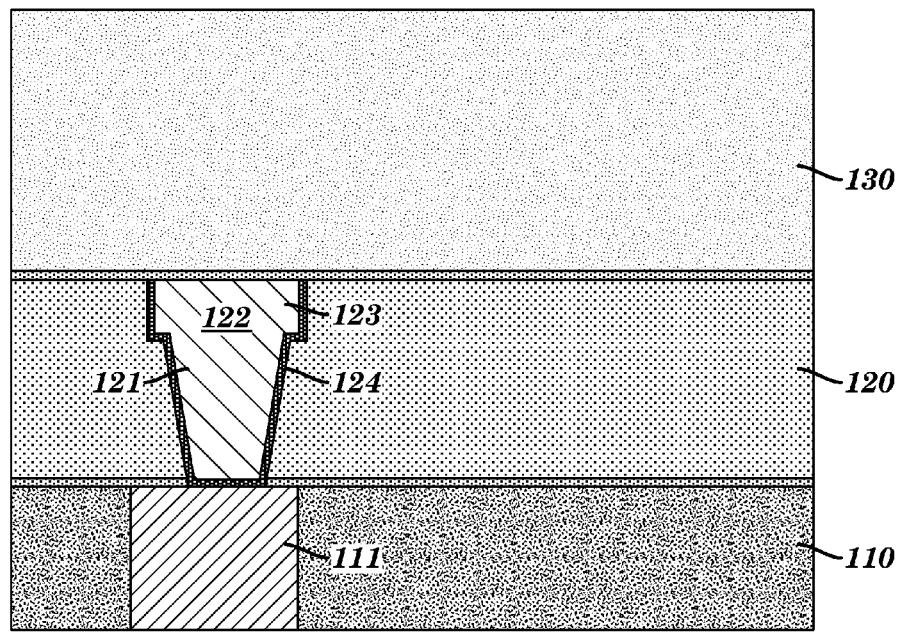
Figure 6F:
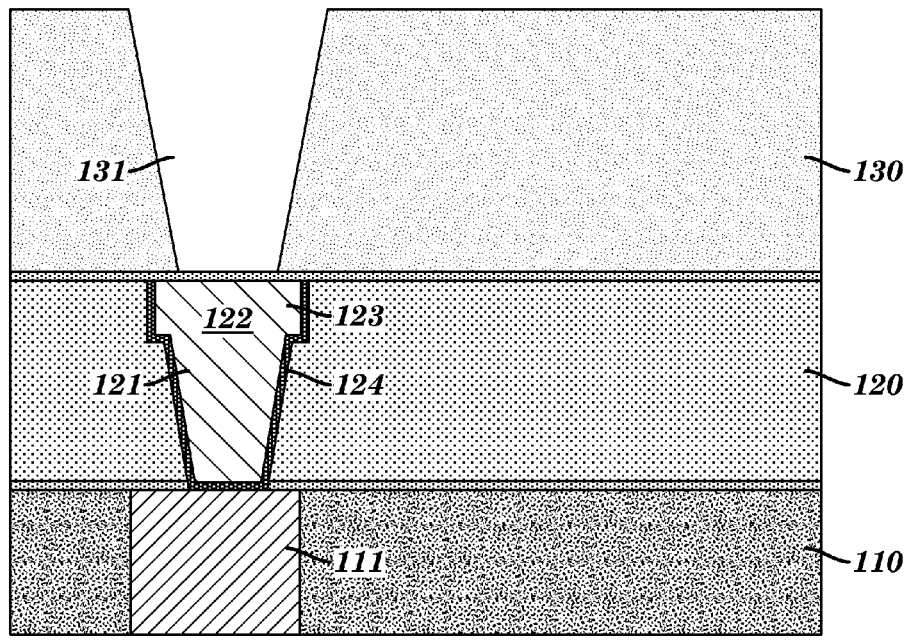
Figure 6G:
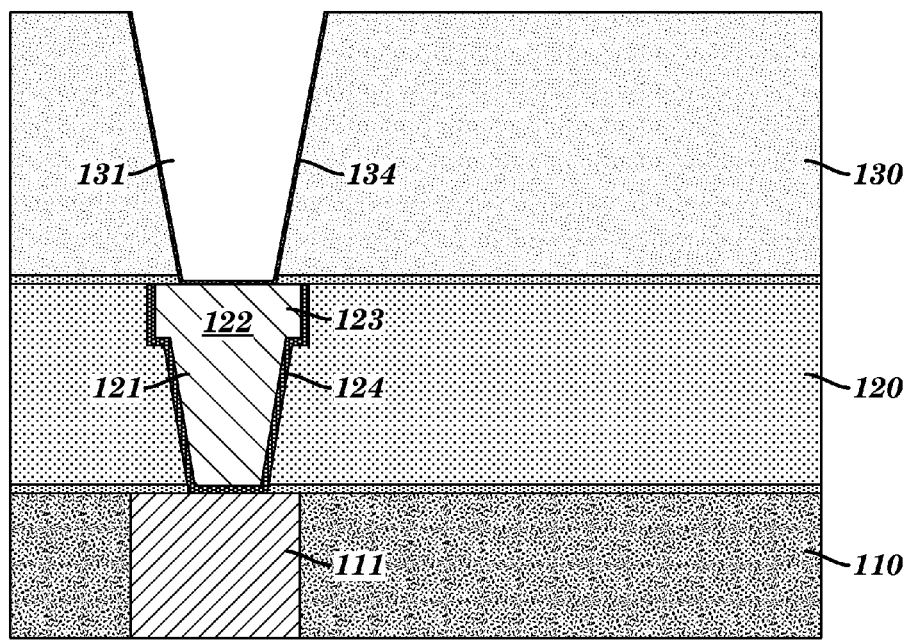
Figure 6H:
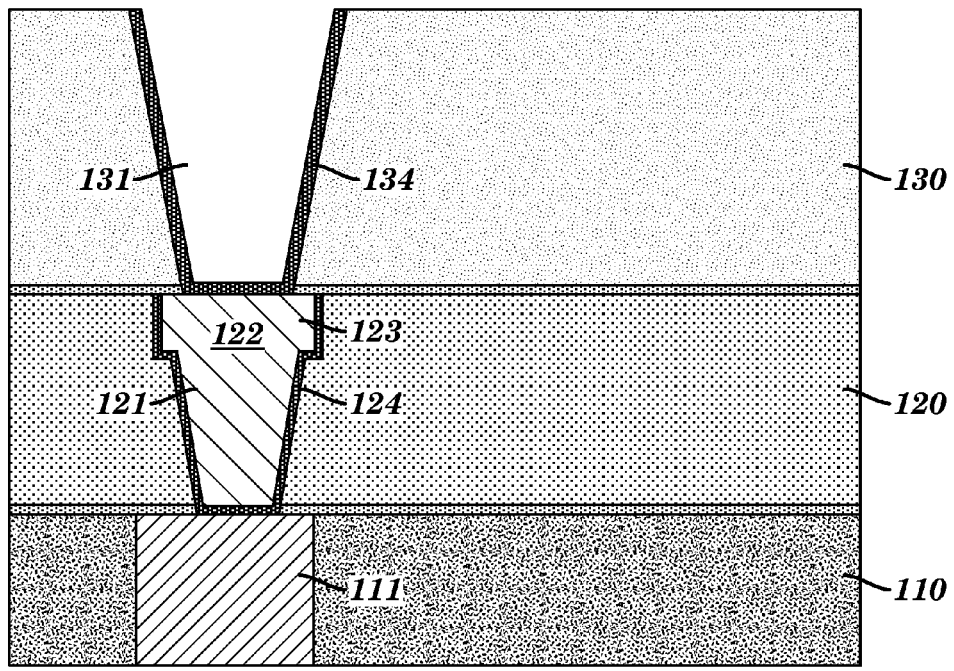
Figure 6I:
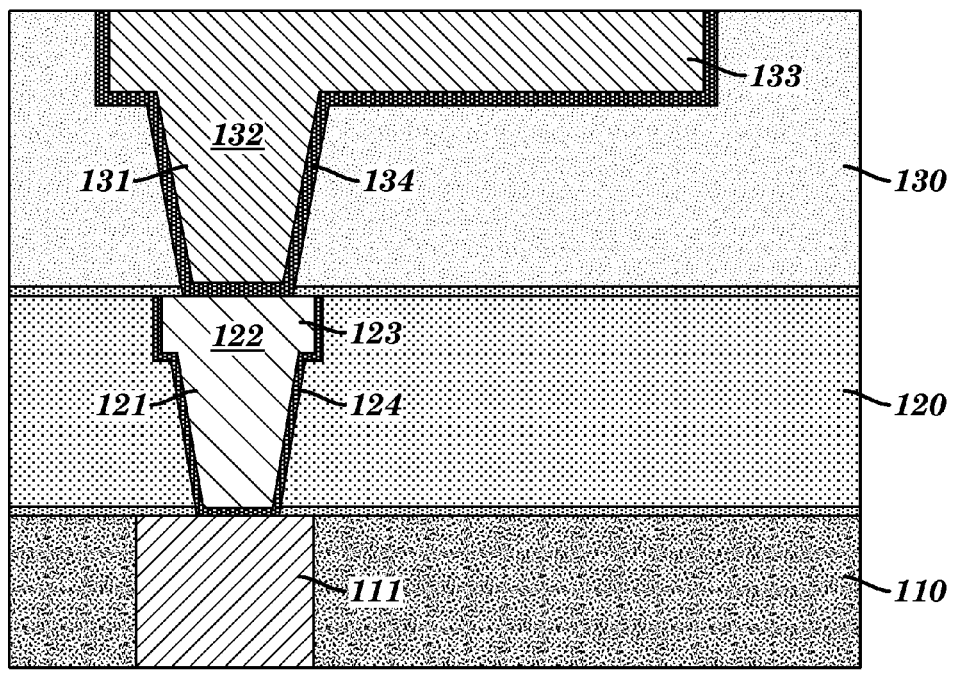

Forcing high current through the fuse structure during fuse programming will likely lead to damage in the surrounding dielectric layer. If conductive via 122 fails, then the resulting damage could be electrically detected by placing vias and lines next to the fuse structure, shown in FIG. 5 as conductive via 142 and conductive line 143. Referring to FIG. 5, detection is made by applying a voltage between a negative voltage connection (V−) and positive voltage connection (V+) and then measuring the current between the positive current connection (I+) and a negative current connection (I−). Negative voltage and current connections are located at conductor 111 and along conductive line 133. Positive voltage and current connections are located at conductive via 142 and conductive line 143. If a short circuit is measured, then the damaged region has extended too far and may lead to reliability concerns. The programming conditions would then be adjusted to produce less damage.

The fuse structure shown in FIG. 2 may be formed using the process shown in FIGS. 6A-6I. First, dielectric layer 120 is deposited on dielectric material 110 having conductor 111 embedded therein. An opening or cavity 121 for conductive via 122 and conductive line 123 is next formed in dielectric layer 120. Preferably, cavity 121 may be a dual damascene cavity to provide openings for conductive via 122 and conductive line 123 simultaneously. Liner 124 is then deposited on at least vertical surfaces of cavity 121 by a physical vapor deposition (PVD) or chemical vapor deposition (CVD) process for example. Preferably, liner 124 is deposited on the bottom surface of cavity 121 as well. A Cu seed layer is deposited by PVD in cavity 121. Cavity 121 with liner 124 is then filled with a conductive material such as Cu using, for example, an electroplating process, to form conductive via 122 and conductive line 123. Via 142 and line 143, as shown in FIG. 5, are also optionally formed by an electroplating process, for example, in dielectric layer 120.

Next, dielectric layer 130 is deposited on layer 120, an opening or cavity 131 is formed in dielectric layer 130, liner 134 is deposited on surfaces of cavity 131, a Cu seed layer is deposited and cavity 131 is filled with a conductive material to form conductive via 132 and conductive line 133. Optionally, conductive line 133 is formed in such a way as to extend in all directions around conductive via 132.

Dielectric layers 120 and 130 can be deposited by a variety of methods. Chemical vapor deposition (CVD) is the preferred method for carbon-doped oxide dielectrics (SiCOH). Spin on processes are the preferred methods for polymer based dielectrics.

Cavity 121 may be formed using any suitable lithographic patterning and etching process. Conductive vias 122 and 132 and conductive lines 123 and 133 may be formed using a single or dual damascene process. Preferably, a dual damascene process is used.

A physical vapor deposition (PVD) process is used to deposit liner materials such as Ta and TaN. Other deposition processes, such as chemical vapor deposition (CVD) and atomic layer deposition (ALD), may be used to deposit liner materials as well.

Figure 7:
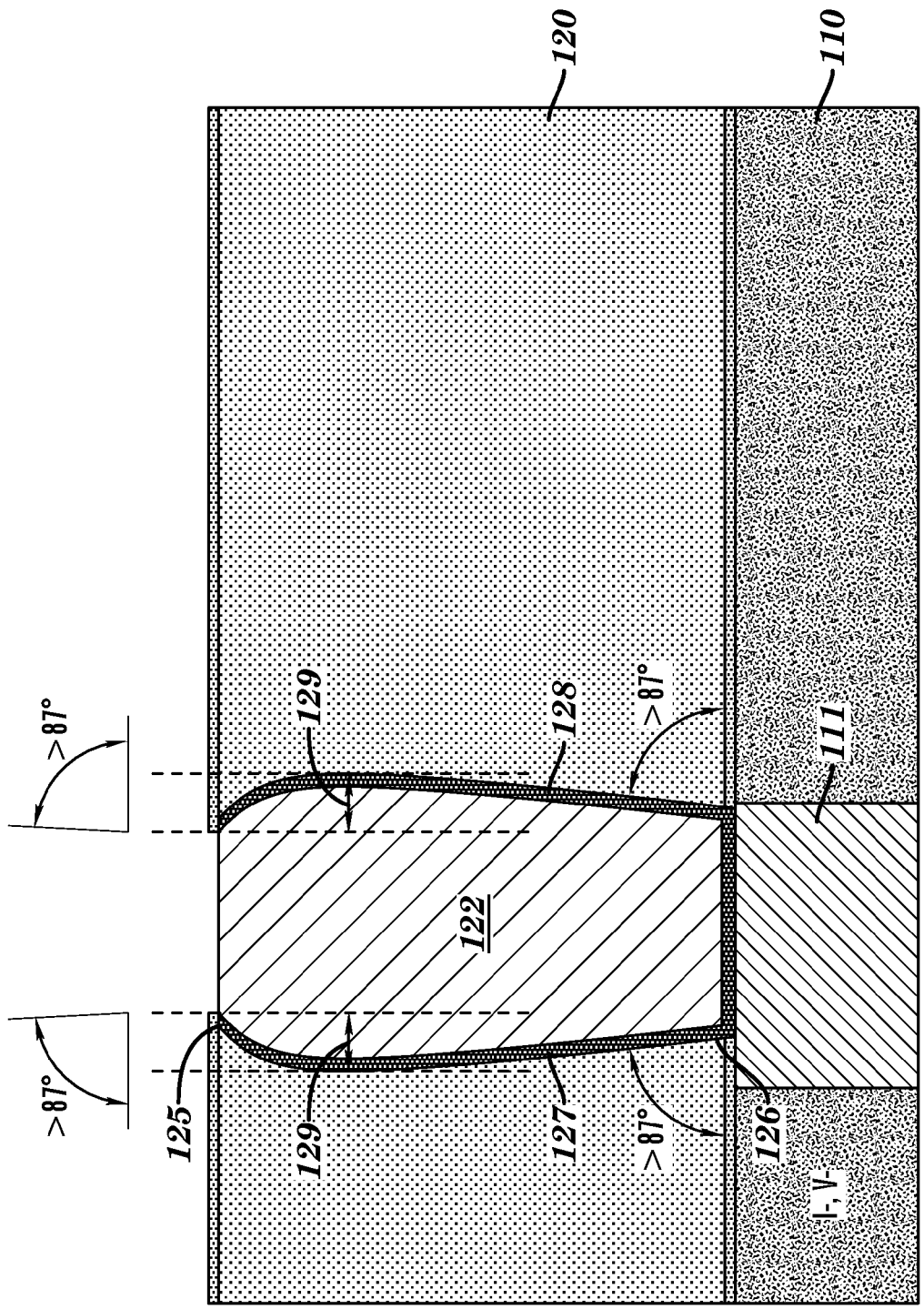
FIG. 7 illustrates methods for creating poor liner coverage in the fuse structure of the present invention.

To promote a failure in the lower via as opposed to the upper via or line, it is preferred to create poor liner coverage in conductive via 122 and good liner coverage in conductive via 132. Multiple embodiments for creating poor liner coverage are shown in FIG. 7. One embodiment for creating poor liner coverage is to create a higher angle at upper portion 125 of conductive via 122. A further embodiment for creating poor liner coverage is to create a steep bottom sidewall 126 of conductive via 122 by creating an angle greater than 87° and a high angle, greater than 87°, at the top sidewall of conductive via 122. Another embodiment for creating poor liner coverage is by undercutting sidewalls 127 and 128 of conductive via 122, preferably such that undercut 129 is greater than 3 nm.

In order to undercut sidewalls 127 and 128 of conductive via 122, the dielectric layer is reactive ion etched through a hardmask for pattern transfer. This creates a dielectric-hardmask stack where the reactive ion etched conductive via 122 has a dense hardmask material on top. The dielectric layer is always a less-dense material than the hardmask, which means that it tends to be more deformable and more easily etchable by, for example, reactive ion etch and wet etches. Moreover, it is more easily deformed by, for example, heating, outgassing, and moisture desorption. The result is that the liner and seed deposition is likely to have a hardmask feature on top that has tighter dimensional tolerances for the patterned features than the less-dense dielectric layer that it serves to pattern. An undercut process can be performed using any low-k dielectric; however the effects of the undercut process are more pronounced using an ultra low-k dielectric. Consequently, an undercut is easy to create or engineer, simply on the basis of selection of a wet clean or reactive ion etch that is selective to the ultra low-k dielectric versus the hardmask, or to degas conditions that cause more shrinkage of the ultra low-k dielectric versus the hardmask. An ultra low-k dielectric material has a dielectric constant less than 2.7.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A fuse structure, comprising:
a first dielectric layer having a first conductive via and a first conductive line disposed in a first cavity formed in said first dielectric layer, said first conductive via and said first conductive line having a first liner disposed along at least vertical surfaces of said first cavity, said first conductive via being in electrical contact with and extending vertically from a bottom of said first conductive line;
a second dielectric layer above said first dielectric layer, said second dielectric layer having a second conductive via and a second conductive line disposed in a second cavity formed in said second dielectric layer, said second conductive via and said second conductive line having a second liner disposed along at least vertical surfaces of said second cavity, said second conductive via being in electrical contact with and extending from a bottom of said second conductive line, said second conductive via being in electrical contact with said first conductive line;
wherein at least a portion of said first liner has a thickness less than said second liner, and
wherein said second conductive line laterally extends around said second conductive via such that said second conductive line is wider in all directions than at least a diameter of an upper portion of said first conductive via.

2. The fuse structure of claim 1, wherein said first liner has a thickness of less than about 30 nm and said second liner has a thickness of greater than about 30 nm.

3. The fuse structure of claim 1, wherein at least one of said first and second cavities are formed using a dual damascene process.

4. The fuse structure of claim 1, wherein the first and second liners comprise a material selected from the group consisting of tantalum (Ta), tantalum nitride (TaN), titanium (Ti), titanium nitride (TiN), tungsten (W), ruthenium (Ru), ruthenium nitride (RuN) and combinations thereof.

5. The fuse structure of claim 1, wherein the first and second dielectric layers comprise a material selected from the group consisting of silicon oxide (SiO), silicon nitride ($Si_3N_4$), hydrogenated silicon oxycarbide (SiCOH), silsesquioxanes, carbon-doped oxides, low dielectric constant materials and combinations thereof.

6. The fuse structure of claim 1, wherein said first conductive line is disposed above said first conductive via and said second conductive line is disposed above said second conductive via.

7. The fuse structure of claim 1, wherein said first dielectric layer is disposed on a dielectric material having a conductor embedded therein, said conductor being in electrical contact with said first conductive via and said first conductive line.

8. The fuse structure of claim 7, wherein the conductor, first and second conductive vias and first and second conductive lines comprise a material selected from the group consisting of copper (Cu), aluminum (Al), silver (Ag), gold (Au) and alloys.

9. A fuse structure, comprising:
   a first dielectric layer having a first conductive via and a first conductive line disposed in a first cavity formed in said first dielectric layer, said first conductive via and said first conductive line having a first liner disposed along at least vertical surfaces of said first cavity, said first conductive via being in electrical contact with and extending vertically from a bottom of said first conductive line; and
   a second dielectric layer disposed on said first dielectric layer, said second dielectric layer having a second conductive via and a second conductive line disposed in a second cavity formed in said second dielectric layer, said second conductive via and said second conductive line having a second liner disposed along at least vertical surfaces of said second cavity, said second conductive via being in electrical contact with and extending from a bottom of said second conductive line, said second conductive via being in electrical contact with said first conductive line, said second conductive line laterally extending around said second conductive via such that said second conductive line extends in all directions wider than at least a diameter of an upper portion of said first conductive via, and
   wherein said first liner has a thickness less than said second liner.

10. The fuse structure of claim 9, wherein said first liner has a thickness of less than about 30 nm and said second liner has a thickness of greater than about 30 nm.

11. The fuse structure of claim 9, further comprising a third conductive via and a third conductive line disposed in a third cavity formed in said first dielectric layer, said third conductive via and said third conductive line having a third liner disposed along at least vertical surfaces of said third cavity, and wherein said third conductive via and said third conductive line are not in contact with said first conductive via.

12. The fuse structure of claim 9, wherein said first conductive line is disposed above said first conductive via and said second conductive line is disposed above said second conductive via.

13. The fuse structure of claim 9, wherein said first dielectric layer is disposed on a dielectric material having a conductor embedded therein, said conductor being in electrical contact with said first conductive via and said first conductive line.

14. A fuse structure for detecting material from damage by a blown fuse, comprising:
   a first dielectric layer disposed on said dielectric material having a first conductive via and a first conductive line disposed in a first cavity formed in said first dielectric layer, said first conductive via and said first conductive line having a first liner disposed along at least vertical surfaces of said first cavity, said first conductive via being in electrical contact with and extending vertically from a bottom of said first conductive line;
   a second conductive via and a second conductive line disposed in a second cavity formed in said first dielectric layer, said second conductive via and said second conductive line having a second liner disposed along at least vertical surfaces of said second cavity, said second conductive via being in electrical contact with and extending from a bottom of said second conductive line, wherein said second conductive via and said second conductive line are not in contact with said first conductive via and said first conductive line;
   a second dielectric layer disposed on said first dielectric layer, said second dielectric layer having a third conductive via and a third conductive line disposed in a third cavity formed in said second dielectric layer, said third conductive via and said third conductive line having a third liner disposed along at least vertical surfaces of said third cavity, said third conductive via being in electrical contact with and extending from a bottom of said third conductive line, said third conductive via being in electrical contact with said first conductive line, said third conductive line laterally extending around said third conductive via such that said third conductive line extends in all directions wider than at least a diameter of an upper portion of said third conductive via;
   wherein said first liner has a thickness less than said third liner.

15. The fuse structure of claim 14, wherein said first liner has a thickness of less than about 30 nm and said third liner has a thickness of greater than about 30 nm.

16. The fuse structure of claim 14, wherein said first conductive line is disposed above said first conductive via and said third conductive line is disposed above said third conductive via.

17. The fuse structure of claim 14, wherein said first dielectric layer is disposed on a dielectric material having a conductor embedded therein, said conductor being in electrical contact with said first conductive via and said first conductive line.

* * * * *